(12) United States Patent
Liu et al.

(10) Patent No.: US 11,139,364 B2
(45) Date of Patent: Oct. 5, 2021

(54) DISPLAY PANEL AND METHOD OF PRODUCING SAME

(71) Applicant: Shenzhen China Star Optoelectronics Semiconductor Display Technology Co., Ltd., Guangdong (CN)

(72) Inventors: Zhaosong Liu, Guangdong (CN); Jangsoon Im, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 646 days.

(21) Appl. No.: 16/074,649

(22) PCT Filed: Apr. 23, 2018

(86) PCT No.: PCT/CN2018/084054
§ 371 (c)(1),
(2) Date: Aug. 1, 2018

(87) PCT Pub. No.: WO2019/169705
PCT Pub. Date: Sep. 12, 2019

(65) Prior Publication Data
US 2021/0210588 A1    Jul. 8, 2021

(30) Foreign Application Priority Data

Mar. 7, 2018 (CN) .......................... 201810185596.5

(51) Int. Cl.
*H01L 27/32* (2006.01)
*H01L 51/52* (2006.01)
*H01L 51/56* (2006.01)

(52) U.S. Cl.
CPC ...... *H01L 27/3279* (2013.01); *H01L 51/5228* (2013.01); *H01L 51/56* (2013.01); *H01L 2227/323* (2013.01)

(58) Field of Classification Search
None
See application file for complete search history.

(56) References Cited

U.S. PATENT DOCUMENTS

2006/0158095 A1\* 7/2006 Imamura ............. H01L 51/5212
                                                                        313/500
2009/0128023 A1    5/2009 Kwak et al.
(Continued)

FOREIGN PATENT DOCUMENTS

CN    101436608 A    5/2009
CN    101506862 A    8/2009
(Continued)

*Primary Examiner* — Evren Seven

(57) ABSTRACT

A display panel and a method of producing the display panel are disclosed. A pixel unit and an auxiliary power supply unit are disposed at a portion of the display panel corresponding to the display sub-areas, the auxiliary power supply unit is configured to supply a power to a cathode layer so that an voltage of each of the display sub-areas applied by the cathode layer is equal to or substantially equal to each other. The cathode layer has a first cathode and a second cathode. The auxiliary power supply unit has a power line and an auxiliary power supply electrode. The display panel has an improved display quality in this disclosure.

17 Claims, 12 Drawing Sheets

(56) References Cited

U.S. PATENT DOCUMENTS

| | | |
|---|---|---|
| 2010/0244667 A1 | 9/2010 | Pan et al. |
| 2013/0210312 A1 | 8/2013 | Fujioka et al. |
| 2016/0064421 A1* | 3/2016 | Oh .................. H01L 27/1218 257/43 |
| 2019/0206979 A1* | 7/2019 | Han .................. H01L 27/3279 |

FOREIGN PATENT DOCUMENTS

| | | |
|---|---|---|
| CN | 103311265 A | 9/2013 |
| CN | 104716156 A | 6/2015 |
| CN | 105590954 A | 5/2016 |

* cited by examiner

DISPLAY PANEL AND METHOD OF PRODUCING SAME

FIELD OF INVENTION

The present invention relates to a display technology, and more particularly to a display panel and a method of producing same.

BACKGROUND OF INVENTION

Transparent cathodes in typical large-sized display panels (e.g. OLED display panels) in a top emission mode has a large resistance, which results in an IR drop in the typical display panel and therefore the typical display panel has uneven light emission.

That is, display of the above typical large-sized display panel is not ideal enough because the transparent cathode has a large resistance.

It is therefore necessary to provide a novel technical solution to solve problems existing in the conventional technology as described above.

SUMMARY OF INVENTION

An object of the present invention is to provide a display panel and a method of producing the same to promote the display quality of the display panel.

For solving above problems, technical solutions of the present invention is as follows:

A display panel, comprising a display area having at least two display sub-areas, wherein at least one pixel unit and at least one auxiliary power supply unit are disposed at a portion of the display panel corresponding to the display sub-areas, the pixel unit is configured to display images, and the auxiliary power supply unit is configured to supply a power to a cathode layer of the display panel so that an voltage of each of the display sub-areas applied by the cathode layer is equal to or substantially equal to each other; wherein the cathode layer comprises a first cathode located at a position corresponding to the auxiliary power supply unit and a second cathode located at a position corresponding to the pixel unit, and the first cathode connects with the second cathode; the auxiliary power supply unit comprises a power line and an auxiliary power supply electrode, and the auxiliary power supply electrode connects with the power line and the first cathode; and the pixel unit comprises a thin film transistor, an anode, an organic light emitting device and the second cathode, the organic light emitting device is disposed between the anode and the second cathode, and the anode connects with a drain of the thin film transistor; wherein the display panel further comprises a pixel defining layer; a first recess portion and a second recess portion are disposed in the pixel defining layer, the first recess portion and the second recess portion both pass through the pixel defining layer, the first recess portion is located at a position corresponding to a position of the auxiliary power supply electrode, and the second recess portion is located at a position corresponding to a position of the anode; at least one portion of the organic light emitting device is disposed on the second recess portion, the portion of the organic light emitting device located on the second recess portion contacts with the anode; and at least one portion of the first cathode is disposed on the first recess portion, the portion of the first cathode located on the first recess portion connects with the auxiliary power supply electrode, at least one portion of the second cathode is disposed on the second recess portion, and the portion of the second cathode located on the second recess portion is disposed on the organic light emitting device; and wherein the display panel further comprises a planarization layer; a first through hole and a second through hole are disposed in the planarization layer; at least one portion of the auxiliary power supply electrode is disposed on the planarization layer, and the other portion of the auxiliary power supply electrode connects with the power line through the first through hole; and at least one portion of the anode is disposed on the planarization layer, and the other portion of the anode connects with the drain through the second through hole.

In the abovementioned display panel, the display panel includes a thin film transistor array device substrate and a display device substrate, and the display device substrate and the thin film transistor array device substrate are stacked to combine together; the power line is disposed on the thin film transistor array device substrate; the planarization layer is disposed on the thin film transistor array device substrate, and the planarization layer covers the power line; and the pixel defining layer is disposed on the planarization layer.

In the abovementioned display panel, the thin film transistor array device substrate further comprises a substrate, a shielding component, a buffer layer, the thin film transistor, a first insulating layer, a second insulating layer, scan lines and data lines, the thin film transistor comprises a gate, a semiconductor component, a source and the drain, wherein the first insulating layer is disposed between the gate and the semiconductor component; and the data lines, at least one portion of the source and at least one portion of the drain are disposed on the second insulating layer.

In the abovementioned display panel, the auxiliary power supply units are uniformly distributed on the display area of the display panel.

A display panel, comprising a display area having at least two display sub-areas, wherein at least one pixel unit and at least one auxiliary power supply unit are disposed at a portion of the display panel corresponding to the display sub-areas, the pixel unit is configured to display images, and the auxiliary power supply unit is configured to supply a power to a cathode layer of the display panel so that an voltage of each of the display sub-areas applied by the cathode layer is equal to or substantially equal to each other; wherein the cathode layer comprises a first cathode located at a position corresponding to the auxiliary power supply unit and a second cathode located at a position corresponding to the pixel unit, and the first cathode connects with the second cathode; the auxiliary power supply unit comprises a power line and an auxiliary power supply electrode, and the auxiliary power supply electrode connects with the power line and the first cathode; and the pixel unit comprises a thin film transistor, an anode, an organic light emitting device and the second cathode, the organic light emitting device is disposed between the anode and the second cathode, and the anode connects with a drain of the thin film transistor.

In the abovementioned display panel, the display panel further comprises a pixel defining layer; a first recess portion and a second recess portion are disposed in the pixel defining layer, the first recess portion and the second recess portion both pass through the pixel defining layer, the first recess portion is located at a position corresponding to a position of the auxiliary power supply electrode, and the second recess portion is located at a position corresponding to a position of the anode; at least one portion of the organic light emitting device is disposed on the second recess portion, the portion of the organic light emitting device located on the second recess portion contacts with the anode; and at least one portion of the first cathode is disposed on the first recess portion, the portion of the first cathode located on the first recess portion connects with the auxiliary power supply electrode, at least one portion of the second cathode is disposed on the second recess portion, and the portion of the second cathode located on the second recess portion is disposed on the organic light emitting device.

In the abovementioned display panel, the display panel further comprises a planarization layer; a first through hole and a second through hole are disposed on the planarization layer; at least one portion of the auxiliary power supply electrode is disposed on the planarization layer, and the other portion of the auxiliary power supply electrode connects with the power line through the first through hole; and at least one portion of the anode is disposed on the planarization layer, and the other portion of the anode connects with the drain through the second through hole.

In the abovementioned display panel, the display panel includes a thin film transistor array device substrate and a display device substrate, and the display device substrate and the thin film transistor array device substrate are stacked to combine together; the power line is disposed on the thin film transistor array device substrate; the planarization layer is disposed on the thin film transistor array device substrate, and the planarization layer covers the power line; and the pixel defining layer is disposed on the planarization layer.

In the abovementioned display panel, the thin film transistor array device substrate further comprises a substrate, a shielding component, a buffer layer, the thin film transistor, a first insulating layer, a second insulating layer, scan lines, and data lines, the thin film transistor comprises a gate, a semiconductor component, a source, and the drain, wherein the first insulating layer is disposed between the gate and the semiconductor component, and the data lines, at least one portion of the source and at least one portion of the drain are disposed on the second insulating layer.

In the abovementioned display panel, the auxiliary power supply units are uniformly distributed on the display area of the display panel.

In the abovementioned display panel, distances between any two of the auxiliary power supply unit adjacent to each other are equal or substantially equal in a first direction or a second direction, wherein the first direction corresponds to a direction of a long side of the display panel, and the second direction corresponds to a direction of a short side of the display panel.

In the abovementioned display panel, at least two the auxiliary power supply units are configured to supply power to the cathode layer of the display panel together.

In the abovementioned display panel, the second cathode is configured to receive a power through the first cathode from the auxiliary power supply unit, and apply voltages to the organic light emitting device together with the anode so that the organic light emitting device emits light.

A method of producing a display panel, wherein the method comprising: a step A of producing a thin film transistor array device substrate; and a step B of producing a display device substrate on the thin film transistor array device substrate, wherein the display device substrate and the thin film transistor array device substrate are stacked to combine together, and the display device substrate includes the at least one pixel unit and the at least one auxiliary power supply unit.

In the abovementioned method of producing the display panel, the step B comprises: a step b1 of forming an auxiliary power supply electrode and the anode; a step b2 of forming a pixel defining layer having a first recess portion and a second recess portion therein, wherein the first recess portion and the second recess portion both pass through the pixel defining layer, the first recess portion is located at a position corresponding to a position of the auxiliary power supply electrode, and the second recess portion is located at a position corresponding to a position of the anode; a step b3 of disposing the organic light emitting device on the pixel defining layer, wherein at least one portion of the organic light emitting device is disposed on the second recess portion, and the portion of the organic light emitting device located on the second recess portion contacts with the anode; and a step b4 of disposing a cathode layer on the first recess portion and the organic light emitting device, wherein the cathode layer comprises the first cathode and the second cathode, the first cathode is disposed at the first recess portion, and the first cathode connects with the auxiliary power supply electrode, the second cathode is disposed at the second recess portion, and the second cathode connects with the anode.

In the abovementioned method of producing the display panel, before the step b1, the step B further comprises: a step b5 of forming a planarization layer; a step b6 of forming a first through hole and a second through hole on the planarization layer; wherein the step b1 comprises: a step b11 of forming the auxiliary power supply electrode on the planarization layer and in the first through hole, wherein at least one portion of the auxiliary power supply electrode is disposed on the planarization layer, and the other portion of the auxiliary power supply electrode connects with the power line through the first through hole; and a step b12 of forming the anode on the planarization layer and in the second through hole, wherein at least one portion of the anode is disposed on the planarization layer, and the other portion of the anode connects with the drain through the second through hole; and wherein the step b2 is to form the pixel defining layer on the planarization layer.

In the abovementioned method of producing the display panel, after the step b3 and before the step b4, the step B further comprises: a step b7 of using a laser beam to remove the portion of the organic light emitting device corresponding to the first recess portion to form a third through hole at a position of the organic light emitting device corresponding to the first recess portion, wherein the auxiliary power supply electrode exposes to the first recess portion and the third through hole.

In the abovementioned method of producing the display panel, before the step b5, the step B further comprises: a step b8 of forming the power line.

In the abovementioned method of producing the display panel, the step A comprises: a step a1 of sequentially disposing a shielding component and a buffer layer on a substrate; a step a2 of disposing a semiconductor component on the buffer layer; a step a3 of disposing a first insulating layer on the semiconductor component; a step a4 of disposing a gate on the first insulating layer; a step a5 of disposing a second insulating layer on the buffer layer, wherein the second insulating layer covers the semiconductor component, the first insulating layer and the gate; a step a6 of forming a fourth through hole and a fifth through hole on the second insulating layer; and a step a7 of disposing a source and the drain on the second insulating layer.

In the abovementioned method of producing the display panel, after the step a4 and before the step a5, the step A further comprises: a step a8 of implanting N+ ions in both terminal portions of the semiconductor component.

Compared to the prior art, the present invention provides an auxiliary power supply electrode within each display sub-area of a display panel, and therefore the auxiliary power supply electrodes can be distributed uniformly. In addition, the auxiliary power supply electrodes commonly supply power to a cathode layer in the display panel having the display sub-areas, and thus the IR Drop phenomenon occurred on the large-sized display panel can be reduced, thereby improving the display quality of the display panel.

In order to more clearly illustrate the technical solutions in the embodiment or in the present invention, the following drawings, which are intended to be used in the description of the embodiment or of the present invention, will be briefly described.

DETAILED DESCRIPTION OF PREFERRED EMBODIMENTS

The word "embodiment" used in this specification means a practice, an example, or an illustration. In addition, the articles "a" and "an" as used in this specification and the appended claims could be generally construed as "one or more" unless specially specified or the singular form can be determined from the context.

A display panel 10 of the present invention is an OLED (Organic Light Emitting Diode, Organic Light Emitting Diode display panel).

Figure 1:
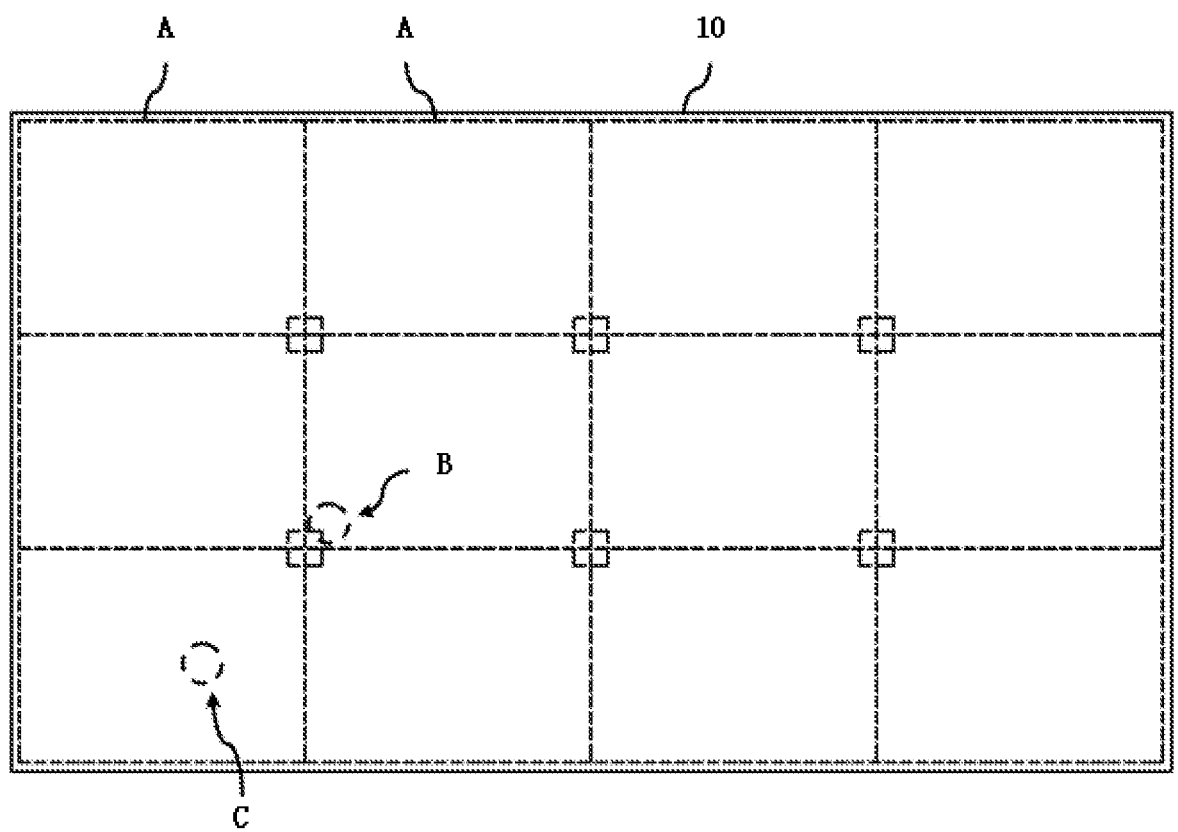
FIG. 1 is a schematic top view showing a display panel of the present invention.
Figure 2:
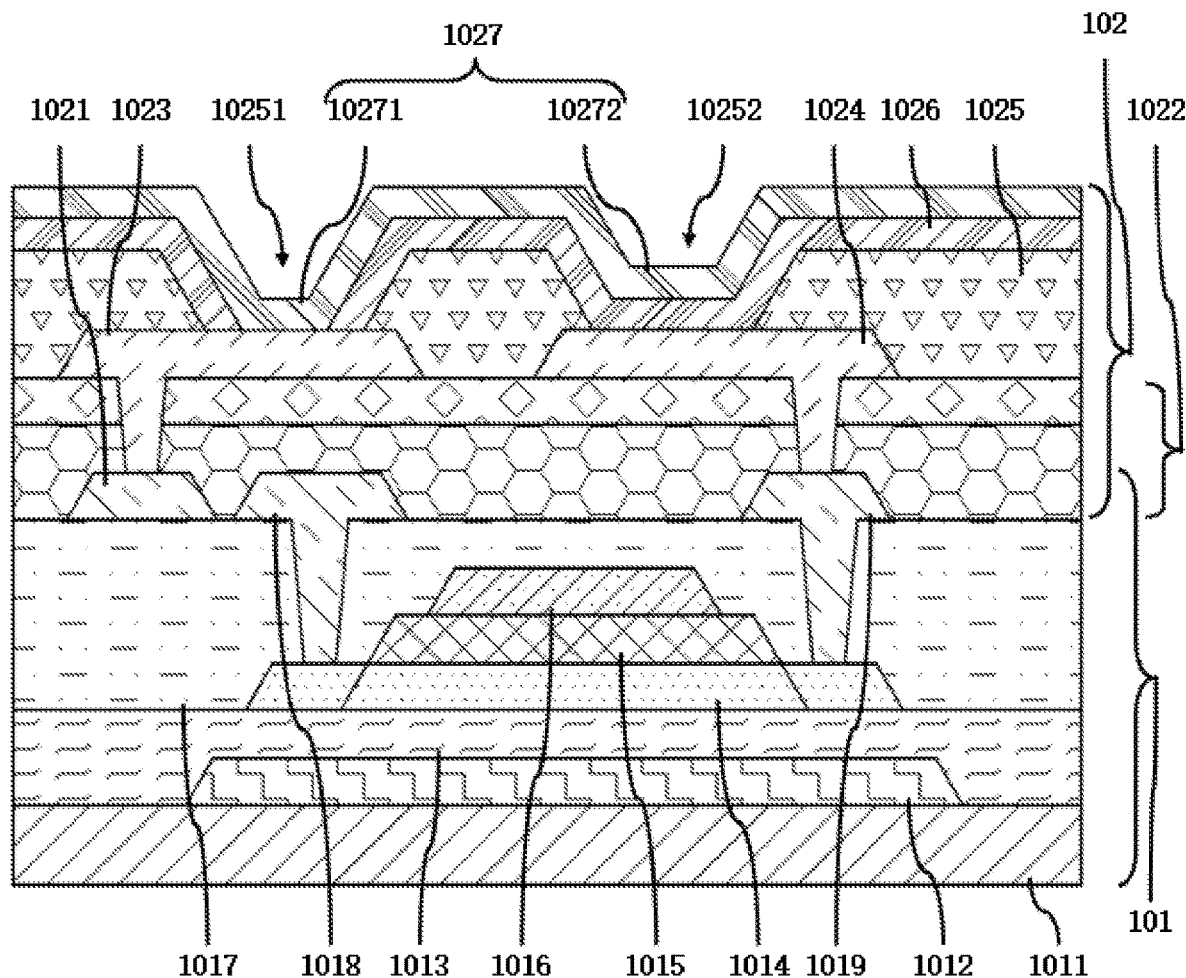
FIG. 2 is a cross-sectional view of area B of the display panel in FIG. 1.
Figure 3:
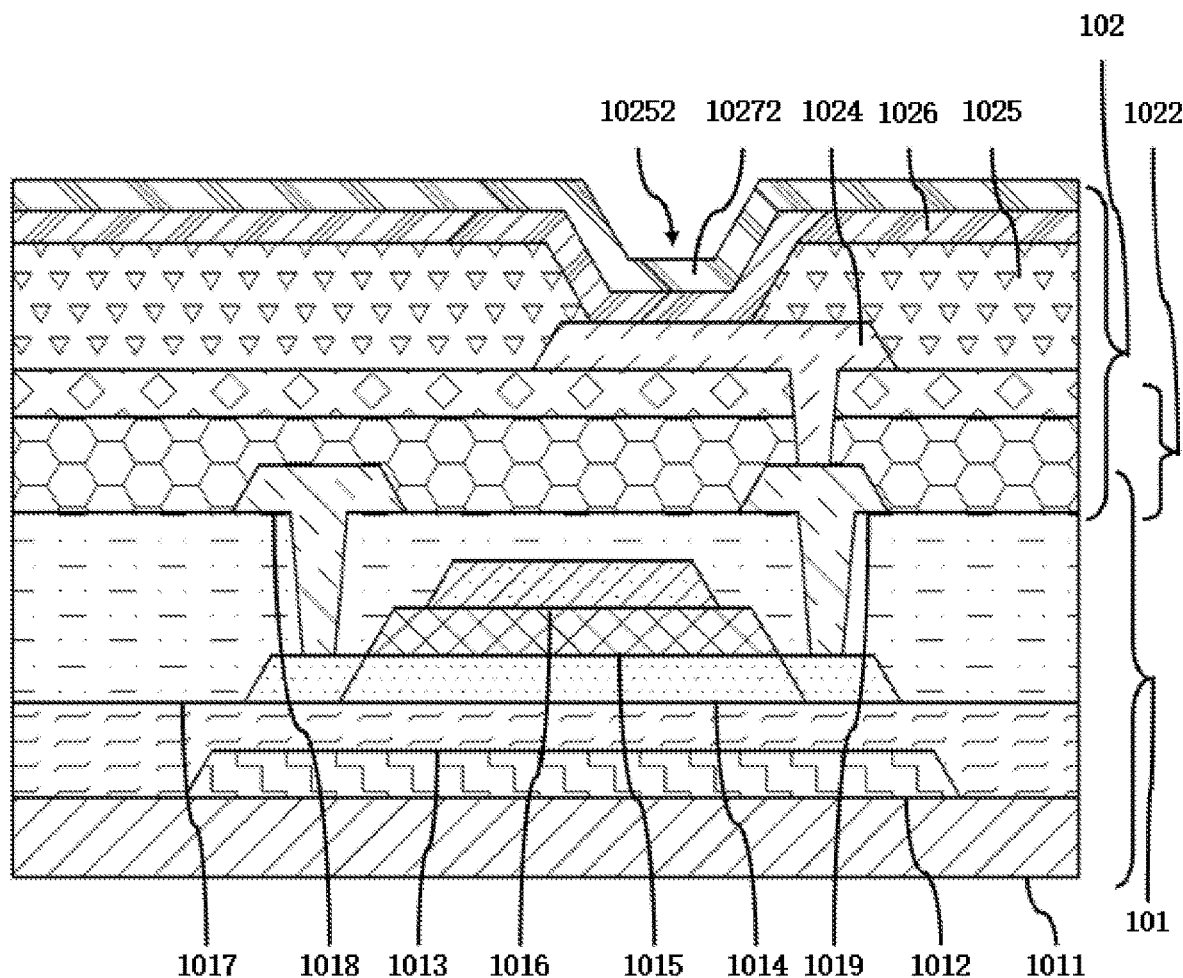
FIG. 3 is a cross-sectional view of area C of the display panel in FIG. 1.
Figure 4:
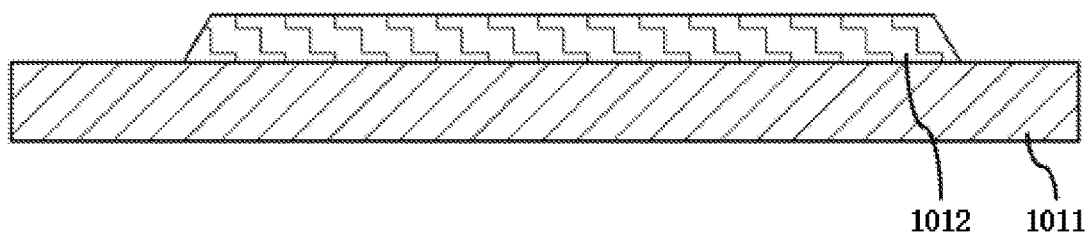
FIG. 4 to FIG. 15 are schematic views of a method of producing a display panel according to the present invention.
Figure 5:
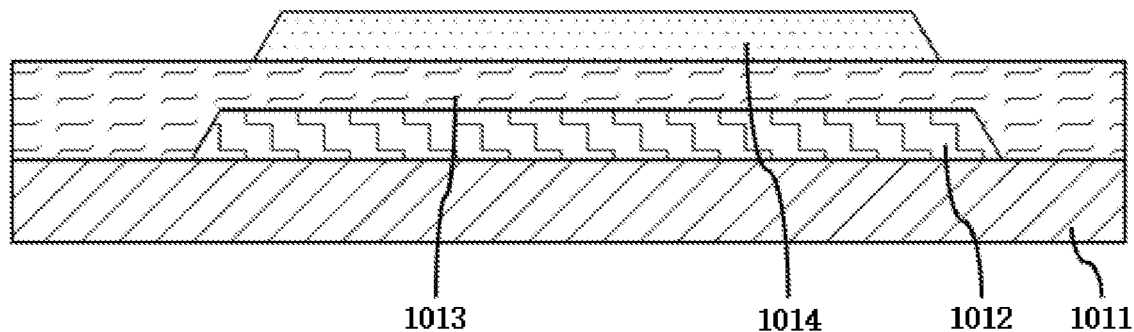
Figure 6:
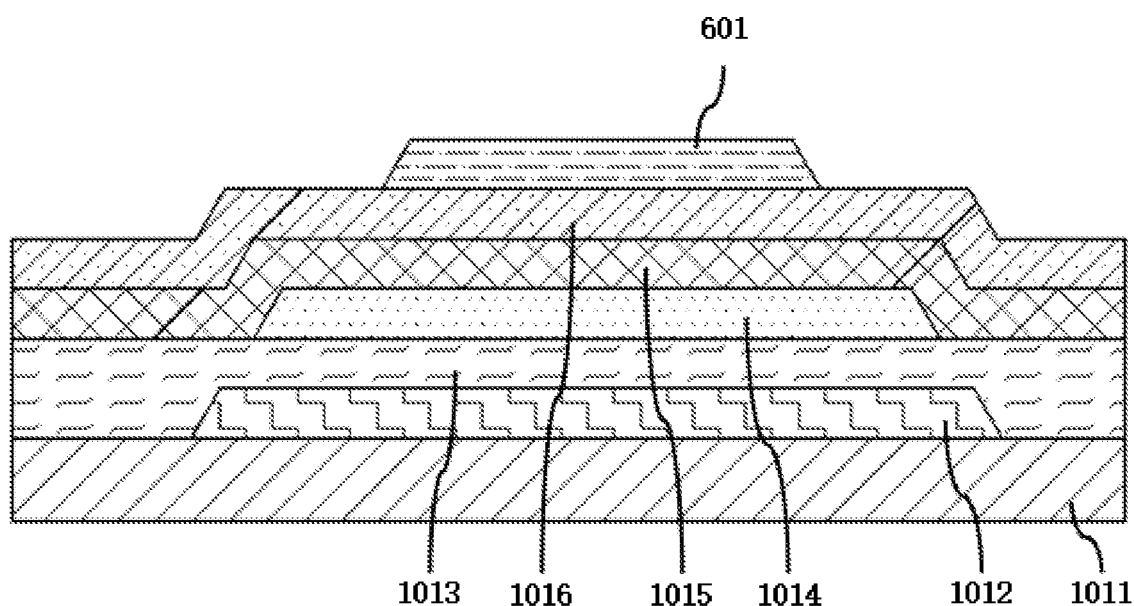
Figure 7:
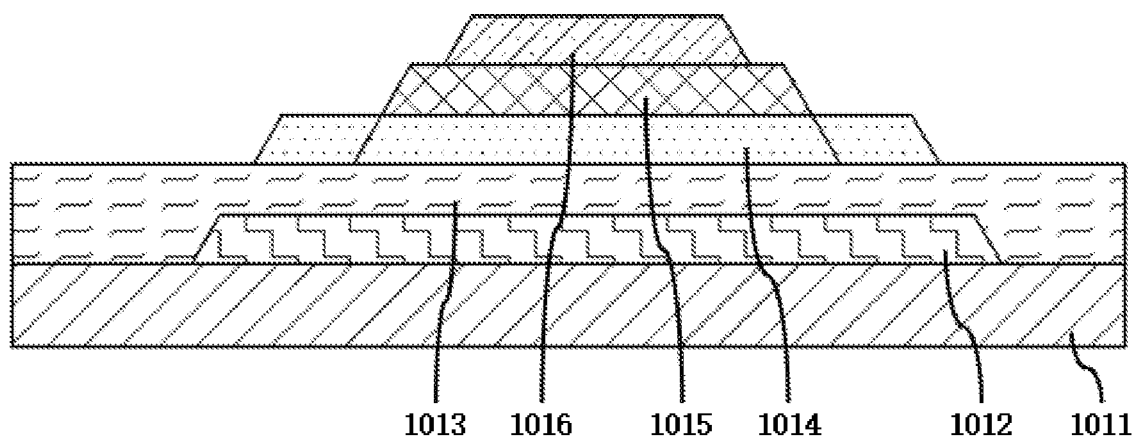
Figure 8:
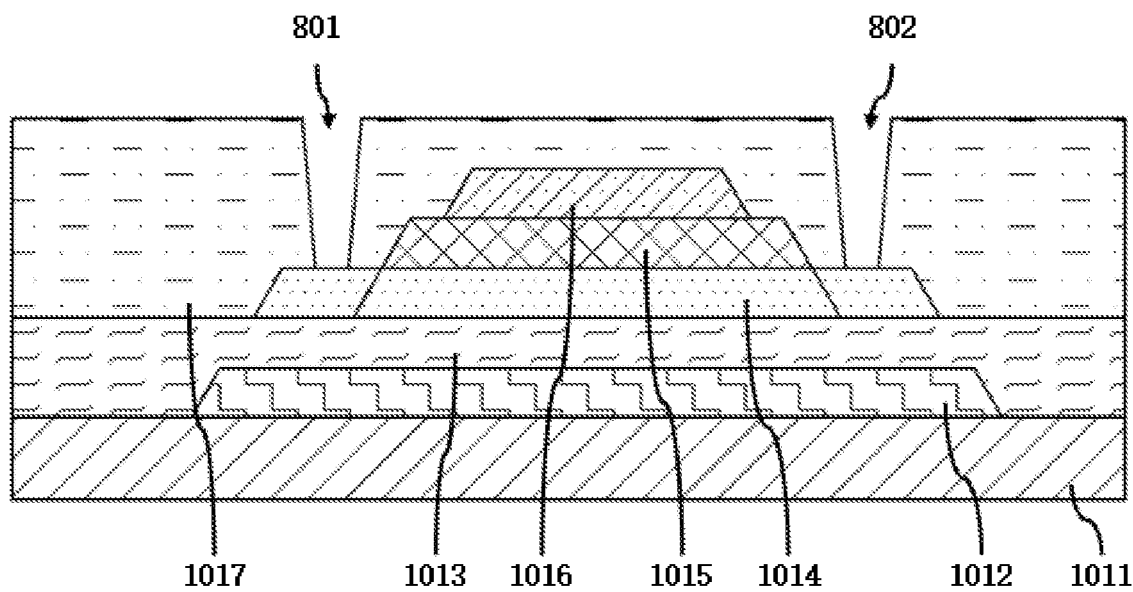
Figure 9:
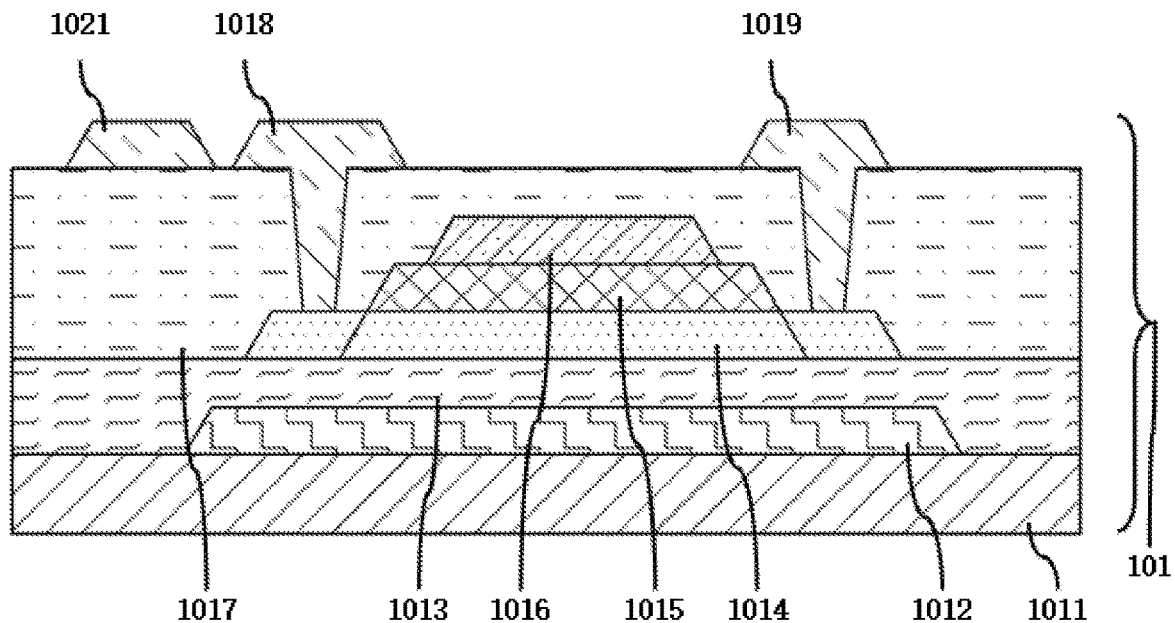
Figure 10:
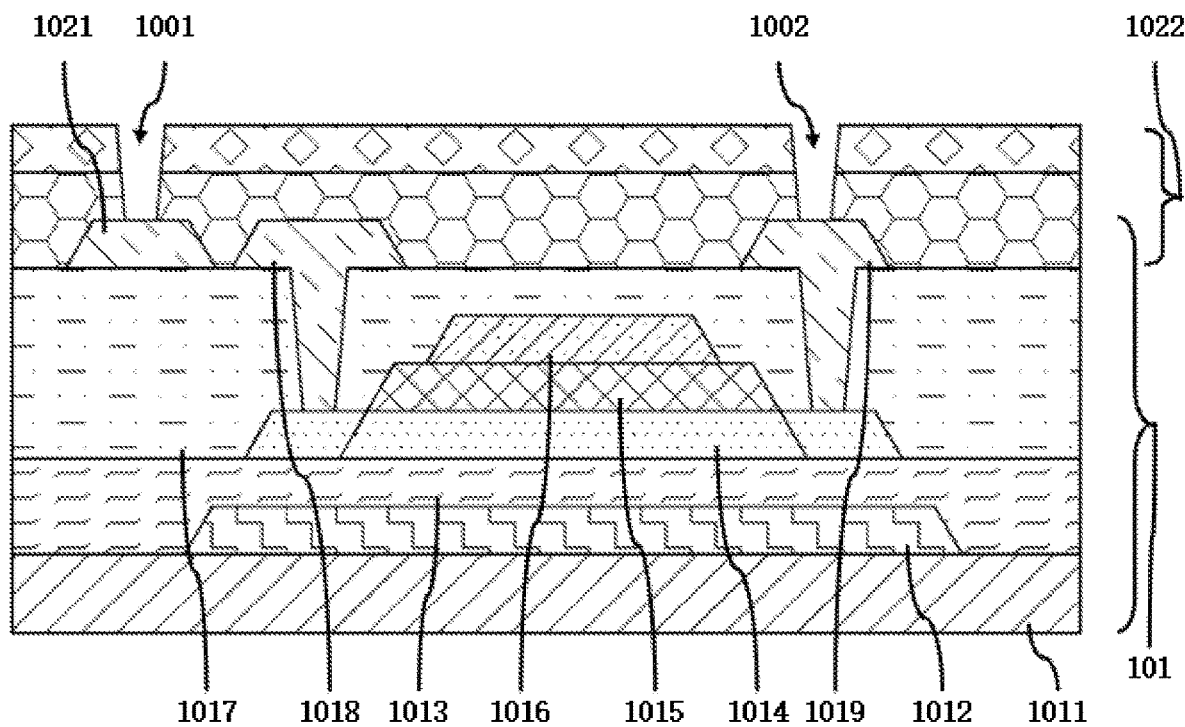
Figure 11:
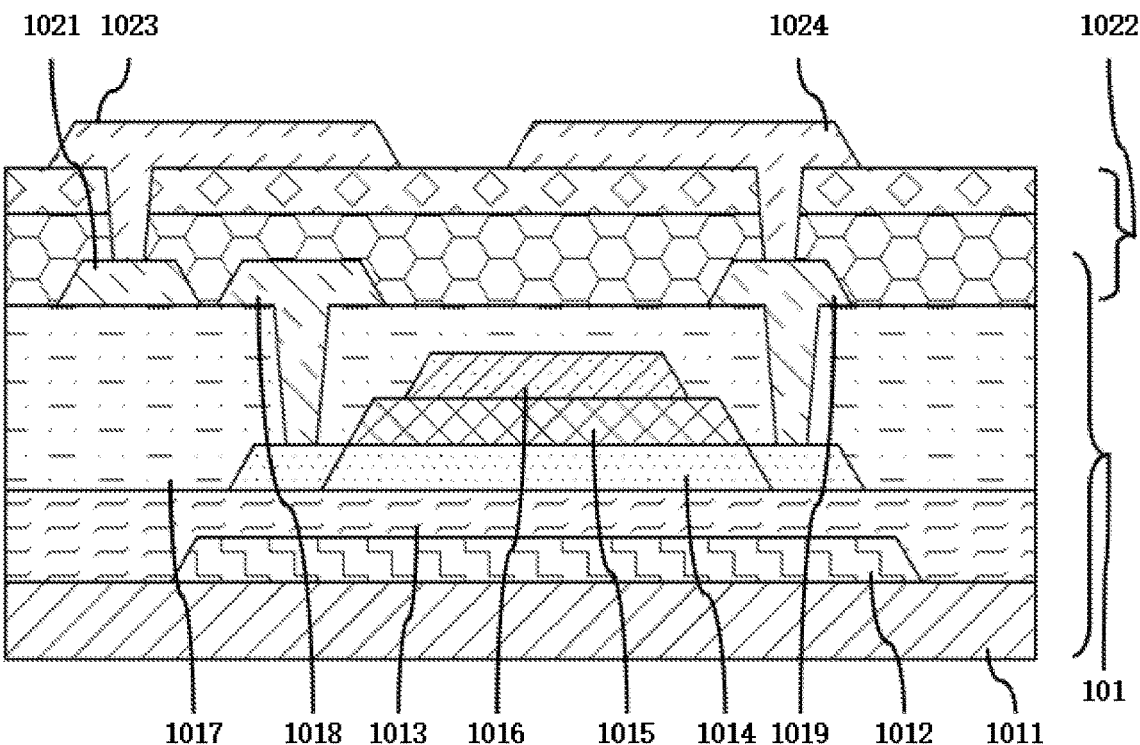
Figure 12:
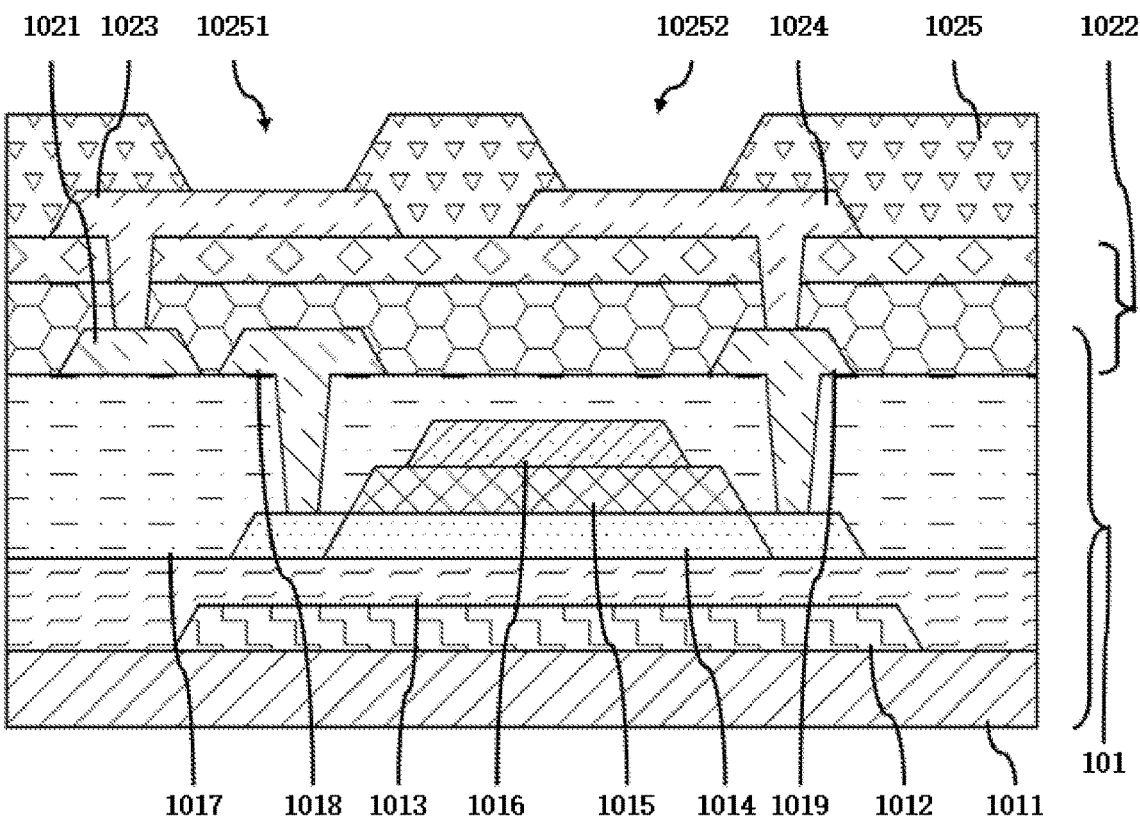
Figure 13:
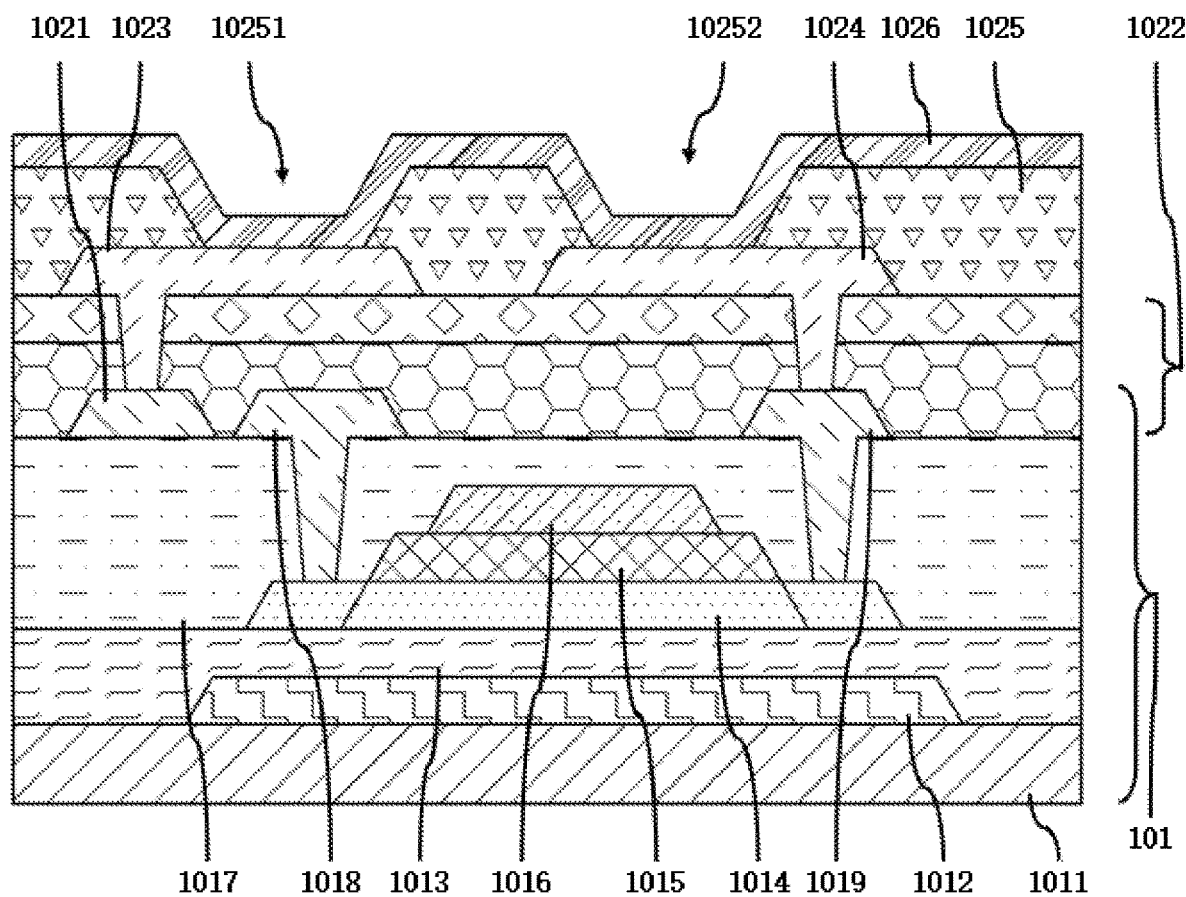
Figure 14:
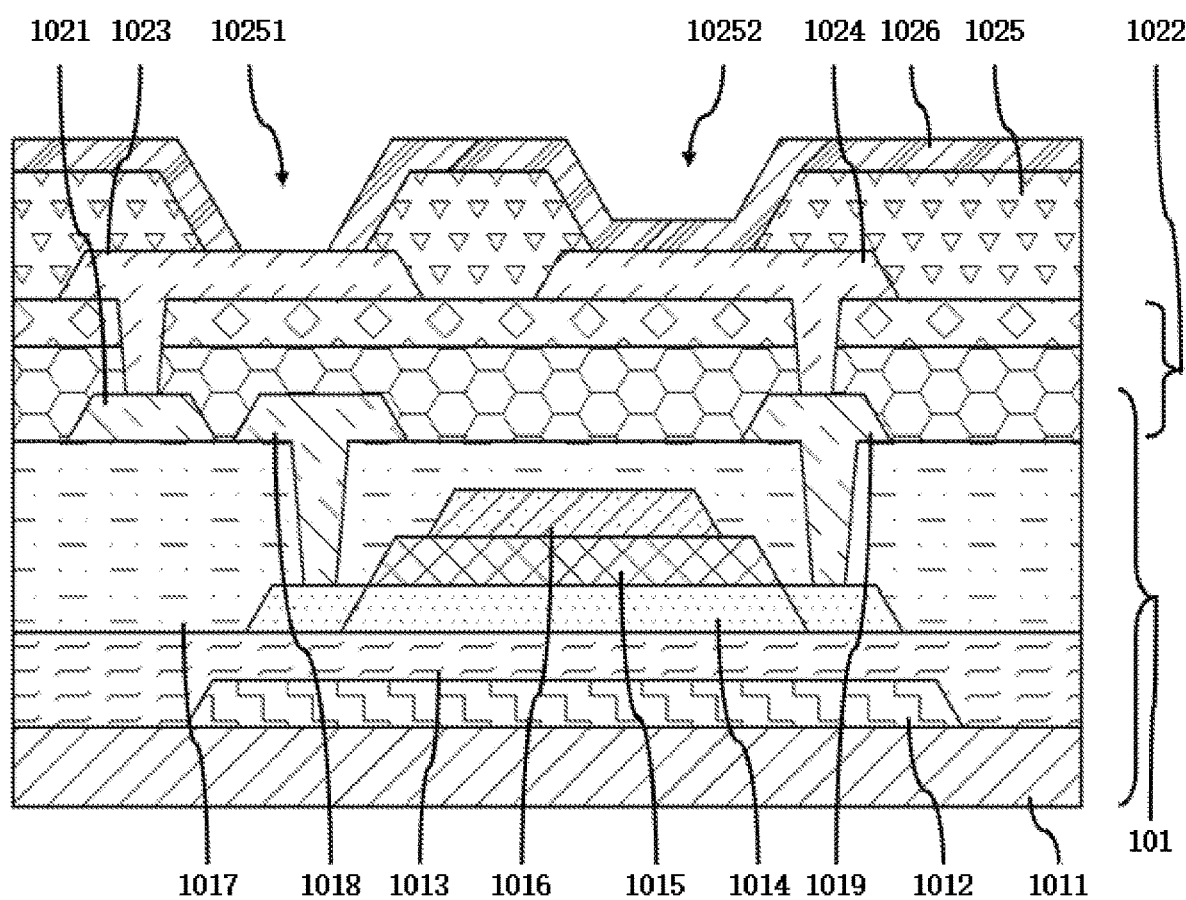
Figure 15:
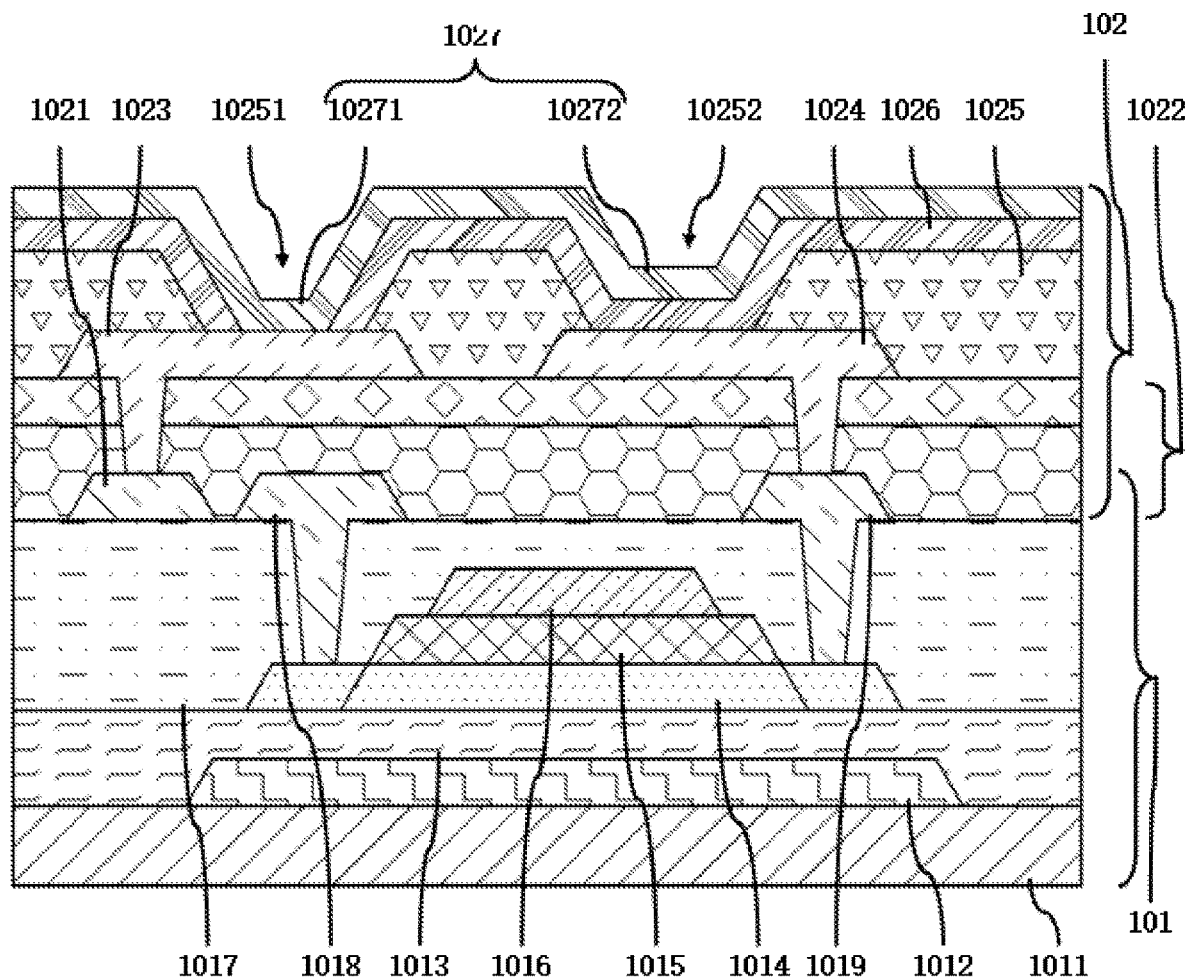

Refer to FIG. 1, FIG. 2, and FIG. 3, FIG. 1 is a schematic view of a display panel 10 of the present invention in a top view, FIG. 2 is a cross-sectional view of an area B of the display panel 10 as shown in FIG. 1, and FIG. 3 is a cross-sectional view of an area C of the display panel as shown in FIG. 2.

The display panel 10 comprises a thin film transistor array device substrate 101 and a display device substrate 102. The display device substrate 102 and the thin film transistor array device substrate 101 are stacked to combine together.

The display panel 10 of the present invention has a display area having at least two display sub-areas A. At least one pixel unit and at least one auxiliary power supply unit are disposed at a portion of the display panel 10 corresponding to the display sub-areas A, the pixel unit is configured to display images, and the auxiliary power supply unit is configured to supply a power to a cathode layer 1027 of the display panel 10 so that an voltage of each of the display sub-areas A applied by the cathode layer 1027 is equal to or substantially equal to each other.

The auxiliary power supply units are uniformly distributed on the display area of the display panel 10. Specifically, distances between any two of the auxiliary power supply unit adjacent to each other are equal or substantially equal in a first direction or a second direction, wherein the first direction corresponds to a direction of a long side of the display panel, and the second direction corresponds to a direction of a short side of the display panel.

At least two of the auxiliary power supply units are configured to supply power to the cathode layer of the display panel 10 together, and thus the distance for supplying power to the cathode layer 1027 can be reduced, so that charges obtained by the cathode layer 1027 are distributed uniformly or substantially uniformly on the surface of the cathode layer 1027. Therefore, it is possible to effectively present the display panel 10 from showing a decrease in display effect at a portion of the cathode layer 1027 away from the voltage receiving end.

In the display panel, the cathode layer 1027 comprises a first cathode 10271 located at a position corresponding to the auxiliary power supply unit and a second cathode 10272 located at a position corresponding to the pixel unit, and the first cathode 10271 connects with the second cathode 10272.

The auxiliary power supply unit comprises a power line 1021 and an auxiliary power supply electrode 1023, and the auxiliary power supply electrode 1023 connects with the power line 1021 and the first cathode 10271.

The power line 1021 is disposed on the thin film transistor array device substrate 101.

The pixel unit comprises a thin film transistor, an anode 1024, an organic light emitting device 1026 and the second cathode 10272, the organic light emitting device 1026 is disposed between the anode 1024 and the second cathode 10272, and the anode 1024 connects with a drain 1019 of the thin film transistor.

The second cathode 10272 is configured to receive a power through the first cathode 10271 from the auxiliary power supply unit (voltages/currents), and apply voltages to the organic light emitting device 1026 together with the anode 1024 so that the organic light emitting device 1026 emits light.

The display panel 10 further comprises a pixel defining layer 1025. The pixel defining layer 1025 is disposed on the planarization layer 1022.

A first recess portion 10251 and a second recess portion 10252 are disposed in the pixel defining layer 1025, the first recess portion 10251 and the second recess portion 10252 both pass through the pixel defining layer 1025, the first recess portion 10251 is located at a position corresponding to a position of the auxiliary power supply electrode 1023, and the second recess portion 10252 is located at a position corresponding to a position of the anode 1024.

The first recess portion 10251 and the second recess portion 10252 are formed by performing a third mask process and a third etching process on a corresponding material layer of the pixel defining layer 1025.

At least one portion of the organic light emitting device 1026 is disposed on the second recess portion 10252, and the portion of the organic light emitting device 1026 located on the second recess portion 10252 contacts with the anode 1024.

At least one portion of the first cathode 10271 is disposed on the first recess portion 10251, the portion of the first cathode 10271 located on the first recess portion 10251 connects (contacts) with the auxiliary power supply electrode 1023, at least one portion of the second cathode 10272 is disposed on the second recess portion 10252, and the portion of the second cathode 10272 located on the second recess portion 10252 is disposed on the organic light emitting device 1026.

A portion of the first cathode 10271 located on the first recess portion 10251 connects (contacts) with the auxiliary power supply electrode 1023, and the portion is formed by using a laser to remove the portion of the organic light emitting device 1026 located on the first recess portion 10251 after disposing the organic light emitting device 1026 on the pixel defining layer 1025 (comprising the first recess portion 10251 and the second recess portion 10252), in order to form a third through hole at a position of the organic light emitting device 1026 corresponding to the first recess portion 10251, and allow the auxiliary power supply electrode 1023 to expose to the first recess portion 10251 and the third through hole, and then disposing the cathode layer 1027 on the organic light emitting device 1026, and exposing to the first recess portion 10251 and the auxiliary power supply electrode 1023 of the third through hole.

The display panel 10 further comprises a planarization layer 1022. The planarization layer 1022 is disposed on the thin film transistor array device substrate 101, and the planarization layer 1022 covers the power line 1021.

A first through hole 1001 and a second through hole 1002 are disposed in the planarization layer. The first through hole 1001 and the second through hole 1002 both pass through the planarization layer 1022. The first through hole 1001 and the second through hole 1002 are formed by performing a second mask process and the third etching process to the planarization layer 1022.

At least one portion of the auxiliary power supply electrode 1023 is disposed on the planarization layer 1022, and the other portion of the auxiliary power supply electrode 1023 connects with the power line 1021 through the first through hole 1001.

At least one portion of the anode 1024 is disposed on the planarization layer 1022, and the other portion of the anode 1024 connects with the drain 1019 through the second through hole 1002.

The thin film transistor array device substrate 101 further comprises a substrate 1011, a shielding component 1012, a buffer layer 1013, the thin film transistor, a first insulating layer 1015, a second insulating layer 1017, scan lines, and data lines. The thin film transistor comprises a gate 1016, a semiconductor component 1014, a source 1018, and the drain 1019, wherein the first insulating layer 1015 is disposed between the gate 1016 and the semiconductor component 1014, and the data lines, at least one portion of the source 1018, and at least one portion of the drain 1019 are disposed on the second insulating layer 1017.

The structure of the thin film transistor of the thin film transistor array device substrate 101 is any of top gate structure, bottom gate structure, and flat gate structure.

Because the display panel 10 in the present invention has an auxiliary power supply electrode 1023, the voltage can be applied to the cathode through the auxiliary power supply electrode 1023 within several areas, thereby IR drop can be reduced to avoid high resistance of the cathode layer 1027 result in the display quality loss of the display panel 10.

Figure 16:
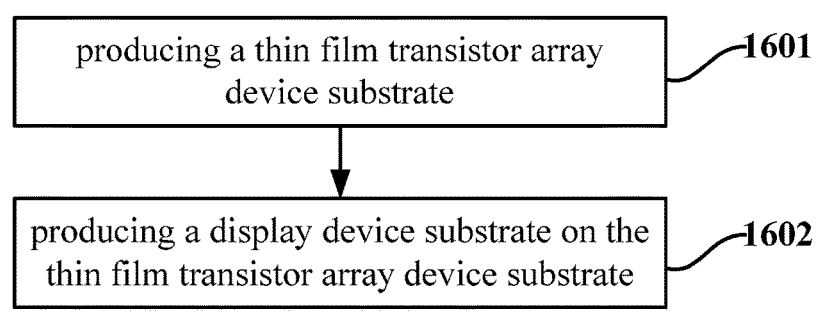
FIG. 16 is a flowchart of a method of producing a display panel according to the present invention.
Figure 17:
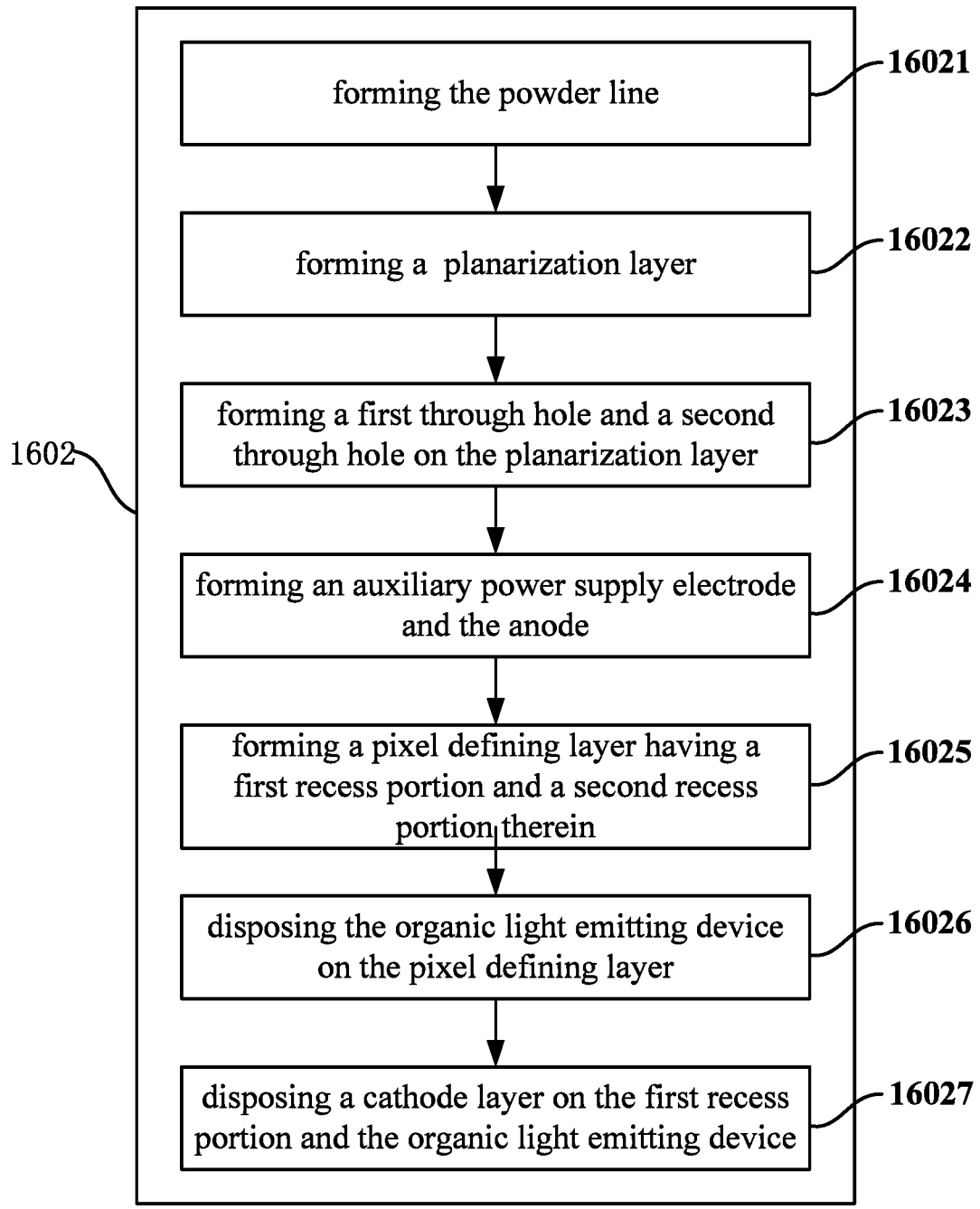
FIG. 17 is a flowchart of steps for producing a display device substrate on a thin film transistor array device substrate in FIG. 16.
Figure 18:
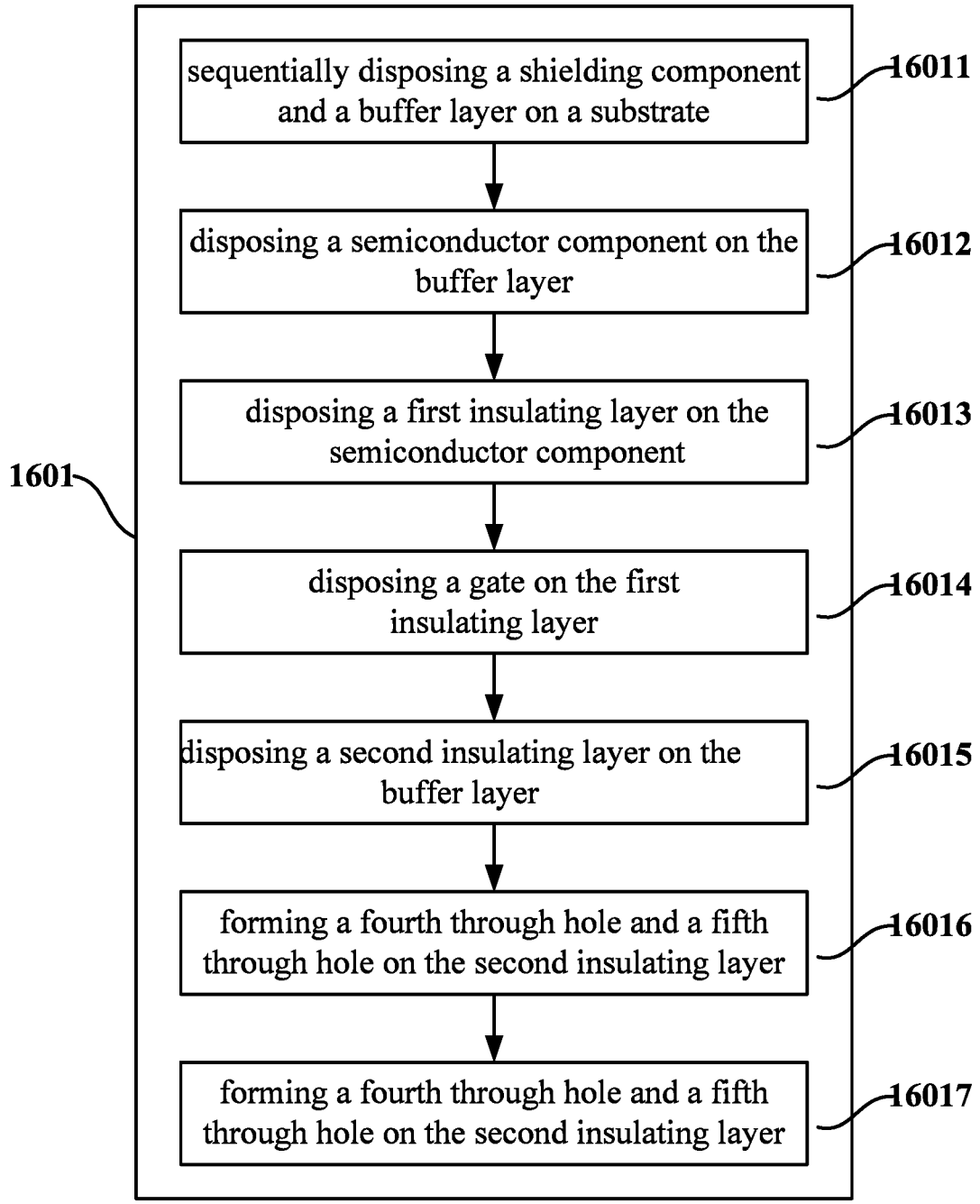
FIG. 18 is a flowchart of steps for producing the thin film transistor array device substrate in FIG. 16.

Refer to FIG. 4 to FIG. 18, FIG. 4 to FIG. 15 are schematic views of a method of producing a display panel according to the present invention, FIG. 16 is a flowchart of a method of producing a display panel according to the present invention, FIG. 17 is a flowchart of steps for producing a display device substrate 102 on a thin film transistor array device substrate 101 in FIG. 16, and FIG. 18 is a flowchart of steps for producing the thin film transistor array device substrate 101 in FIG. 16.

A method of producing a display panel according to the present invention is used for producing the display panel 10 in the present invention, the method comprises steps as follows:

Step A (step 1601): producing a thin film transistor array device substrate 101; and Step B (step 1602): producing a display device substrate 102 on the thin film transistor array device substrate 101, wherein the display device substrate 102 and the thin film transistor array device substrate 101 are stacked to combine together, and the display device substrate 102 includes the at least one pixel unit and the at least one auxiliary power supply unit.

The step A (step 1601) includes:

Step a1 (step 16011): sequentially disposing a shielding component 1012 and a buffer layer 1013 on a substrate 1011. Specifically, depositing a shielding metal layer on the substrate 1011, and patterning the shielding metal layer by a first mask process and a first etching process, thereby forming the shielding component 1012, and then depositing the buffer layer 1013 on the substrate 1011 and the shielding component 1012.

Step a2 (step 16012): disposing a semiconductor component 1014 on the buffer layer 1013. Specifically, depositing a semiconductor layer on the buffer layer 1013, and patterning the semiconductor layer by a second mask process and a second etching process, thereby forming the semiconductor component 1014.

Step a3 (step 16013): disposing a first insulating layer 1015 on the semiconductor component 1014.

Step a4 (step 16014): disposing a gate 1016 on the first insulating layer 1015.

Step a5 (step 16015) disposing a second insulating layer 1017 on the buffer layer 1013, wherein the second insulating layer 1017 covers the semiconductor component 1014, the first insulating layer 1015, and the gate 1016.

Step a6 (step 16016): forming a fourth through hole 801 and a fifth through hole 802 on the second insulating layer 1017. Specifically, performing a fourth mask process to the second insulating layer 1017 to form the fourth through hole 801 and the fifth through hole 802.

Step a7 (step 16017): disposing a source 1018 and the drain 1019 on the second insulating layer 1017. Specifically, disposing a second metal layer on the second insulating layer 1017, and performing a fifth mask process and a fifth etching process to the second metal layer to form the source 1018 and the drain 1019.

Further, simultaneously forming the source 1018, the drain 1019, and the power line in the second metal layer by the fifth mask process and the fifth etching process.

The above step a3 (step 16013) and step a4 (step 16014) specifically include: subsequently depositing a first insulating material layer and a second insulating material layer on the semiconductor component 1014, and disposing a photoresist (PR, Photo Resist) block 601 on the first metal layer; performing a third mask process on the first insulating material layer and the first metal layer, thereby patterning the first insulating material layer and the first metal layer, and then performing a third etching process on the patterned first metal layer to form the gate 1016, and then using the gate 1016 to self-align to etch the first insulating material layer, so as to expose both terminal portions of the semiconductor component 1014.

Further, after the step a4 (step 16014) and before the step a5 (step 16015), the step A (step 1601) further comprises:

Step a8: implanting N+ ions in both terminal portions of the semiconductor component 1014.

The step B (step 1602) comprises:

Step b1 (step 16024): forming the auxiliary power supply electrode 1023 and the anode 1024. Specifically, disposing a third metal layer on a position of the planarization layer 1022 corresponding to the first through hole 1001 and the second through hole 1002, and performing a seventh mask process and a seventh etching process on the third metal layer to from the auxiliary power supply electrode 1023 and the anode 1024.

Step b2 (step 16025): forming a pixel defining layer 1025 having a first recess portion 10251 and a second recess portion 10252 therein, wherein the first recess portion 10251 and the second recess portion 10252 both pass through the pixel defining layer 1025, the first recess portion 10251 is located at a position corresponding to a position of the auxiliary power supply electrode 1023, and the second recess portion 10252 is located at a position corresponding to a position of the anode 1024. Specifically, disposing a material layer corresponding to the pixel defining layer 1025 on the planarization layer 1022, and performing a eighth mask process and a eighth etching process on the material layer to form the first recess portion 10251 and the second recess portion 10252 passing through the material layer.

Step b3 (step 16026): disposing the organic light emitting device 1026 on the pixel defining layer 1025, wherein at least one portion of the organic light emitting device 1026 is disposed on the second recess portion 10252, and the portion of the organic light emitting device 1026 located on the second recess portion 10252 contacts with the anode 1024. Specifically, an OLED material is evaporated on the entire surface of the pixel defining layer 1025 to form the organic light emitting device 1026.

Step b4 (step 16027): disposing a cathode layer 1027 on the first recess portion 10251 and the organic light emitting device 1026, wherein the cathode layer 1027 comprises the first cathode 10271 and the second cathode 10272, the first cathode 10271 is disposed at the first recess portion 10251, and the first cathode 10271 connects with the auxiliary power supply electrode 1023, the second cathode 10272 is disposed at the second recess portion 10252, and the second cathode 10272 connects with the anode 1024.

Further, after the step b3 (step 16026) and before the step b4 (step 16027), the step B (step 1602) further comprise:

a step b7 of using a laser beam to remove the portion of the organic light emitting device 1026 corresponding to the first recess portion 10251 to form a third through hole at a position of the organic light emitting device 1026 corresponding to the first recess portion 10251, wherein the auxiliary power supply electrode 1023 exposes to the first recess portion 10251 and the third through hole, wherein the diameter of the cross-section of the laser beam is smaller than the diameter of the third through hole. Specifically, removing the portion of the organic light emitting device 1026 corresponding to the first recess portion 10251 in nitrogen or vacuum by using the laser beam.

The step b4 (step 16027) is to:

dispose the cathode layer 1027 on the auxiliary power supply electrode 1023 exposing to the first recess portion 10251 and the third through hole, and on the organic light emitting device 1026.

Before the step b1 (step 16024), the step B (step 1602) further comprises:

Step b5 (step 16022): forming a planarization layer 1022.
Step b6 (step 16023): disposing a first through hole 1001 and a second through hole 1002 on the planarization layer 1022. Specifically, performing a sixth mask process and a seventh etching process on the planarization layer 1022 to form the first through hole 1001 and the second through hole 1002.

The step b1 (step 16024) comprises:

Step b11: forming the auxiliary power supply electrode 1023 on the planarization layer 1022 and in the first through hole 1001, wherein at least one portion of the auxiliary power supply electrode 1023 is disposed on the planarization layer 1022, and the other portion of the auxiliary power supply electrode 1023 connects with the power line 1021 through the first through hole 1001.

Step b12: forming the anode 1024 on the planarization layer 1022 and in the second through hole 1002, wherein at least one portion of the anode 1024 is disposed on the planarization layer 1022, and the other portion of the anode 1024 connects with the drain 1019 through the second through hole 1002.

The step b2 (step 16025) is to:

Form the pixel defining layer 1025 on the planarization layer 1022.

Before the step b5 (step 16022), the step B (step 1602) further comprises:

Step b8 (step 16021): forming the power line 1021.

The technical solution of the method of producing the display panel according to the present invention comprises:

(1) cleaning a substrate (glass substrate) 1011, and depositing a metal having a thickness ranging from 500 Å to 2000 Å on the substrate 1011 to serve as a TFT shielding layer (shielding metal layer). The metal can be Mo, Al, Cu, and Ti etc., or an alloy, and the metal is patterned by yellow light to form the shielding component 1012.

(2) depositing a layer of silicon oxide (SiOx) film on the substrate 1011 and the shielding component 1012 to serve as a buffer layer (Buffer) 1013. The buffer layer 1013 has a thickness ranging from 1000 Å to 5000 Å.

(3) depositing a layer of metal oxide semiconductor material (Oxides) on the buffer layer 1013 to serve as a semiconductor layer. The metal oxide semiconductor material can be IGZO, IZTO, IGZTO, etc., and the semiconductor layer has a thickness ranging from 100 Å to 1000 Å, and the semiconductor layer is patterned by yellow light to form the semiconductor component 1014.

(4) depositing a layer of silicon oxide (SiOx) film on the buffer layer 1013 and the semiconductor component 1014 to serve as a gate insulating layer (first insulating layer 1015), and the gate insulating layer has a thickness ranging from 1000 Å to 3000 Å.

(5) depositing a layer of metal on the gate insulating layer to serve as a gate metal layer (first metal layer), the gate metal layer can be Mo, Al, Cu, Cu, or an alloy, and the gate metal layer has a thickness ranging from 2000 Å to 8000 Å.

(6) patterning the gate metal layer by an yellow light. First, the patterned gate metal layer is etched to form a gate metal, and then the gate metal is self-aligned to etch the gate insulating layer, so that the gate insulating layer only exists under the film layer of the gate metal, and the other portion of the gate insulating layer is etched off.

(7) treating the semiconductor component 1014 by implanting ions (Plasma), thereby reducing the resistance of the metal oxide semiconductor material (Oxides) having no protection of the gate insulating layer (the first insulating layer 1015) and the gate metal (the gate) thereon and to form an N+ conductive layer for contacting with a source 1018 and a drain 1019 of a thin film transistor. The metal oxide semiconductor material under the gate insulating layer is not treated so that it keeps the semiconductor property to serve as an electron migration channel of the thin film transistor (TFT).

(8) depositing an interlayer insulating layer (ILD), i.e. a second insulating layer 1017, on the buffer layer 1013, the semiconductor component 1014, and the gate 1016. The material of the second insulating layer 1017 can be silicon oxides (SiOx), silicon nitride (SiNx), or a sandwich structure. The second insulating layer 1017 has a thickness ranging from 3000 Å to 10000 Å, and contact openings of the source 1018 and the drain 1019 (the fourth through hole 801 and the fifth through hole 802) are made on the second insulating layer 1017.

(9) depositing a layer of metal on the second insulating layer 1017 to serve as a source 1018/drain 1019 metal layer (second metal layer), the material of the source 1018/drain 1019 metal layer can be Mo, Al, Cu, Cu, or an alloy. The source 1018/drain 1019 metal layer has a thickness ranging from 2000 Å to 8000 Å, and then patterning the source 1018/drain 1019 metal layer to define their patterns to form the source 1018 and the drain 1019, and simultaneously form the power line 1021.

(10) depositing a SiOx film to serve as a first planarization layer (passivation layer) on the second insulating layer 1017 and the source 1018, the drain 1019 and the power line 1021. The passivation layer has a thickness ranging from 1000 Å to 5000 Å, and the passivation layer is etched to form through holes (the first through hole 1001 and the second through hole 1002).

(11) producing a second planarization layer on the passivation layer. The second planarization layer can be photo resists having different composition. The second planarization layer has a thickness ranging from 10000 Å to 20000 Å, and through holes (the first through hole 1001 and the second through hole 1002) are made by an yellow light through the second planarization layer.

(12) depositing transparent oxides, such as ITO, or a sandwich structure such as ITO/Ag/ITO, on the planarization layer 1022 comprising the first planarization layer and the second planarization layer, and the thickness of the ITO transparent oxide or the sandwich structure of ITO/Ag/ITO ranges from 500 Å to 2000 Å, and then patterning by an yellow light to form an anode 1024 and the auxiliary power supply electrode 1023.

(13) producing a pixel defining layer 1025 (PDL layer) on the planarization layer 1022 and the anode 1024. The pixel defining layer 1025 may include photoresist layers with different integrations. The pixel defining layer 1025 has a thickness ranging from 10000 Å to 20000 Å. An emitting area can be defined through the pixel defining layer 1025 by using an yellow light and a backside plate can be formed completely.

(14) producing a light emitting layer on the entire surface of the pixel defining layer 1025, and using a laser beam irradiation to remove the portion of the light emitting layer located at the auxiliary power supply electrode 1023 in nitrogen (N2) or in vacuum, in order to ensure that a cathode can be connected to an auxiliary electrode. The diameter of the cross section of the laser beam (laser irradiation point) needs to be smaller than the opening of the pixel electrode layer at the auxiliary power supply electrode 1023 to ensure that the material of the light emitting layer in the normal region is not damaged and contaminated.

(15) producing a cathode metal on the auxiliary power supply electrode 1023 and the light emitting layer, and the cathode connects with the auxiliary electrode at a design position to complete the fabrication of the OLED panel.

The above technical solution can improve the IR drop issue in the large-sized display panel 10. That is, since the present invention provides an auxiliary power supply electrode 1023 within each display sub-area A of a display panel 10, the auxiliary power supply electrodes can be distributed uniformly. The auxiliary power supply electrodes 1023 commonly supply power to a cathode layer 1027 in the display panel having the display sub-areas A, and thus the IR drop happens to the large-sized display panel 10 can be reduced, thereby improving display quality of the display panel 10.

In addition, in the method of producing the display panel according to the present invention, because the OLED material at the auxiliary power supply electrode 1023 is treated by means of the laser beam irradiation to connect the cathode to the auxiliary power supply electrode 1023, it is possible to avoid the introduction of a yellow light process such as Pillar, and the process is simple.

In summary, the present invention has been described with preferred embodiments thereof and it is understood that many changes and modifications to the described embodiments can be carried out by the skilled person in the art without departing from the scope and the spirit of the invention that is intended to be limited only by the appended claims.

What is claimed is:

1. A display panel, comprising a display area having at least two display sub-areas, wherein at least one pixel unit and at least one auxiliary power supply unit are disposed at a portion of the display panel corresponding to the display sub-areas, the pixel unit is configured to display images, and the auxiliary power supply unit is configured to supply power to a cathode layer of the display panel so that voltage of each of the display sub-areas applied by the cathode layer is equal to or substantially equal to each other;

wherein the cathode layer comprises a first cathode located at a position corresponding to the auxiliary power supply unit and a second cathode located at a position corresponding to the pixel unit, and the first cathode connects with the second cathode;

the auxiliary power supply unit comprises a power line and an auxiliary power supply electrode, and the auxiliary power supply electrode connects with the power line and the first cathode; and the pixel unit comprises a thin film transistor, an anode, an organic light emitting device and the second cathode, the organic light emitting device is disposed between the anode and the second cathode, and the anode connects with a drain of the thin film transistor;

wherein the display panel further comprises a pixel defining layer;

a first recess portion and a second recess portion are disposed in the pixel defining layer, the first recess portion and the second recess portion both pass through the pixel defining layer, the first recess portion is located at a position corresponding to a position of the auxiliary power supply electrode, and the second recess portion is located at a position corresponding to a position of the anode;

at least one portion of the organic light emitting device is disposed on the second recess portion, the portion of the organic light emitting device located on the second recess portion contacts with the anode; and at least one portion of the first cathode is disposed on the first recess portion, the portion of the first cathode located on the first recess portion connects with the auxiliary power supply electrode, at least one portion of the second cathode is disposed on the second recess portion, and the portion of the second cathode located on the second recess portion is disposed on the organic light emitting device; and wherein the display panel further comprises a planarization layer;

a first through hole and a second through hole are disposed in the planarization layer;

at least one portion of the auxiliary power supply electrode is disposed on the planarization layer, and the other portion of the auxiliary power supply electrode connects with the power line through the first through hole;

at least one portion of the anode is disposed on the planarization layer, and the other portion of the anode connects with the drain through the second through hole; and a third through hole is formed at a position of the organic light emitting device corresponding to the first recess portion, wherein the auxiliary power supply electrode is exposed to the first recess portion and the third through hole.

2. The display panel according to claim 1, wherein the display panel includes a thin film transistor array device substrate and a display device substrate, and the display device substrate and the thin film transistor array device substrate are stacked to combine together;

the power line is disposed on the thin film transistor array device substrate;

the planarization layer is disposed on the thin film transistor array device substrate, and the planarization layer covers the power line; and the pixel defining layer is disposed on the planarization layer.

3. The display panel according to claim 2, wherein the thin film transistor array device substrate further comprises a substrate, a shielding component, a buffer layer, the thin film transistor, a first insulating layer, a second insulating layer, scan lines and data lines, the thin film transistor comprises a gate, a semiconductor component, a source and the drain, wherein the first insulating layer is disposed between the gate and the semiconductor component; and the data lines, at least one portion of the source, and at least one portion of the drain are disposed on the second insulating layer.

4. The display panel according to claim 1, wherein the auxiliary power supply units are uniformly distributed on the display area of the display panel.

5. A display panel, comprising a display area having at least two display sub-areas, wherein at least one pixel unit and at least one auxiliary power supply unit are disposed at a portion of the display panel corresponding to the display sub-areas, the pixel unit is configured to display images, and the auxiliary power supply unit is configured to supply a power to a cathode layer of the display panel so that an voltage of each of the display sub-areas applied by the cathode layer is equal to or substantially equal to each other;

wherein the cathode layer comprises a first cathode located at a position corresponding to the auxiliary power supply unit and a second cathode located at a position corresponding to the pixel unit, and the first cathode connects with the second cathode;

the auxiliary power supply unit comprises a power line and an auxiliary power supply electrode, and the auxiliary power supply electrode connects with the power line and the first cathode;

the pixel unit comprises a thin film transistor, an anode, an organic light emitting device and the second cathode, the organic light emitting device is disposed between the anode and the second cathode, and the anode connects with a drain of the thin film transistor;

wherein the display panel further comprises a pixel defining layer;

a first recess portion and a second recess portion are disposed in the pixel defining layer, the first recess portion and the second recess portion both pass through the pixel defining layer, the first recess portion is located at a position corresponding to a position of the auxiliary power supply electrode, and the second recess portion is located at a position corresponding to a position of the anode; and a third through hole is formed at a position of the organic light emitting device corresponding to the first recess portion, wherein the auxiliary power supply electrode is exposed to the first recess portion and the third through hole.

6. The display panel according to claim 5, wherein at least one portion of the organic light emitting device is disposed on the second recess portion, the portion of the organic light emitting device located on the second recess portion contacts with the anode; and at least one portion of the first cathode is disposed on the first recess portion, the portion of the first cathode located on the first recess portion connects with the auxiliary power supply electrode, at least one portion of the second cathode is disposed on the second recess portion, and the portion of the second cathode located on the second recess portion is disposed on the organic light emitting device.

7. The display panel according to claim 5, wherein the display panel further comprises a planarization layer;

a first through hole and a second through hole are disposed in the planarization layer;

at least one portion of the auxiliary power supply electrode is disposed on the planarization layer, and the other portion of the auxiliary power supply electrode connects with the power line through the first through hole; and at least one portion of the anode is disposed on the planarization layer, and the other portion of the anode connects with the drain through the second through hole.

8. The display panel according to claim 7, wherein the display panel includes a thin film transistor array device substrate and a display device substrate, and the display device substrate and the thin film transistor array device substrate are stacked to combine together;

the power line is disposed on the thin film transistor array device substrate;

the planarization layer is disposed on the thin film transistor array device substrate, and the planarization layer covers the power line; and the pixel defining layer is disposed on the planarization layer.

9. The display panel according to claim 8, wherein the thin film transistor array device substrate further comprises a substrate, a shielding component, a buffer layer, the thin film transistor, a first insulating layer, a second insulating layer, scan lines and data lines, the thin film transistor comprises a gate, a semiconductor component, a source and the drain, wherein the first insulating layer is disposed between the gate and the semiconductor component; and the data lines, at least one portion of the source and at least one portion of the drain are disposed on the second insulating layer.

10. The display panel according to claim 5, wherein the auxiliary power supply units are uniformly distributed on the display area of the display panel.

11. The display panel according to claim 5, wherein distances between any two of the auxiliary power supply unit adjacent to each other are equal or substantially equal in a first direction or a second direction, wherein the first direction corresponds to a direction of a long side of the display panel, and the second direction corresponds to a direction of a short side of the display panel.

12. The display panel according to claim 5, wherein at least two of the auxiliary power supply units are configured to supply power to the cathode layer of the display panel together.

13. The display panel according to claim 5, wherein the second cathode is configured to receive a power through the first cathode from the auxiliary power supply unit, and apply voltages to the organic light emitting device together with the anode so that the organic light emitting device emits light.

14. A method of producing a display panel as claimed in claim 5, wherein the method comprising:
    a step A of producing a thin film transistor array device substrate; and
    a step B of producing a display device substrate on the thin film transistor array device substrate, wherein the display device substrate and the thin film transistor array device substrate are stacked to combine together, and the display device substrate includes the at least one pixel unit and the at least one auxiliary power supply unit; wherein the step B comprises:
    a step b1 of forming an auxiliary power supply electrode and the anode;
    a step b2 of forming a pixel defining layer having a first recess portion and a second recess portion therein, wherein the first recess portion and the second recess portion both pass through the pixel defining layer, the first recess portion is located at a position corresponding to a position of the auxiliary power supply electrode, and the second recess portion is located at a position corresponding to a position of the anode;
    a step b3 of disposing the organic light emitting device on the pixel defining layer, wherein at least one portion of the organic light emitting device is disposed on the second recess portion, and the portion of the organic light emitting device located on the second recess portion contacts with the anode; and
    a step b4 of disposing a cathode layer on the first recess portion and the organic light emitting device, wherein the cathode layer comprises the first cathode and the second cathode, the first cathode is disposed at the first recess portion, and the first cathode connects with the auxiliary power supply electrode, the second cathode is disposed at the second recess portion, and the second cathode connects with the anode;
    wherein before the step b1, the step B further comprises:
    a step b5 of forming a planarization layer;
    a step b6 of forming a first through hole and a second through hole on the planarization layer;
    wherein the step b1 comprises:
    a step b11 of forming the auxiliary power supply electrode on the planarization layer and in the first through hole, wherein at least one portion of the auxiliary power supply electrode is disposed on the planarization layer, and the other portion of the auxiliary power supply electrode connects with the power line through the first through hole; and
    a step b12 of forming the anode on the planarization layer and in the second through hole, wherein at least one portion of the anode is disposed on the planarization layer, and the other portion of the anode connects with the drain through the second through hole; and
    wherein the step b2 is to:
    form the pixel defining layer on the planarization layer;
    wherein after the step b3 and before the step b4, the step B further comprises:
    a step b7 of using a laser beam to remove the portion of the organic light emitting device corresponding to the first recess portion to form a third through hole at a position of the organic light emitting device corresponding to the first recess portion, wherein the auxiliary power supply electrode is exposed to the first recess portion and the third through hole.

15. The method of producing a display panel according to claim 14, wherein before the step b5, the step B further comprises:
    a step b8 of forming the power line.

16. The method of producing a display panel according to claim 14, wherein the step A comprises:
    a step a1 of sequentially disposing a shielding component and a buffer layer on a substrate;
    a step a2 of disposing a semiconductor component on the buffer layer;
    a step a3 of disposing a first insulating layer on the semiconductor component;
    a step a4 of disposing a gate on the first insulating layer;
    a step a5 of disposing a second insulating layer on the buffer layer, wherein the second insulating layer covers the semiconductor component, the first insulating layer and the gate;
    a step a6 of forming a fourth through hole and a fifth through hole on the second insulating layer; and
    a step a7 of disposing a source and the drain on the second insulating layer.

17. The method of producing a display panel according to claim 16, wherein after the step a4 and before the step a5, the step A further comprises:
    a step a8 of implanting N+ ions in both terminal portions of the semiconductor component.

* * * * *